United States Patent
Lopez

(10) Patent No.: US 11,005,021 B2
(45) Date of Patent: May 11, 2021

(54) PERIPHERAL HEAT SINKING ARRANGEMENT FOR HIGH BRIGHTNESS LIGHT EMITTING DEVICES

(71) Applicant: KONINKLIJKE PHILIPS N.V., Eindhoven (NL)

(72) Inventor: Toni Lopez, Aachen (DE)

(73) Assignee: KONINKLIJKE PHILIPS N.V.

( * ) Notice: Subject to any disclaimer, the term of this patent is extended or adjusted under 35 U.S.C. 154(b) by 0 days.

(21) Appl. No.: 15/562,855

(22) PCT Filed: Mar. 23, 2016

(86) PCT No.: PCT/EP2016/056323
§ 371 (c)(1),
(2) Date: Sep. 28, 2017

(87) PCT Pub. No.: WO2016/156135
PCT Pub. Date: Oct. 6, 2016

(65) Prior Publication Data
US 2018/0108823 A1    Apr. 19, 2018

Related U.S. Application Data

(60) Provisional application No. 62/139,820, filed on Mar. 30, 2015.

(51) Int. Cl.
*H01L 33/64* (2010.01)
*H01L 33/50* (2010.01)
(Continued)

(52) U.S. Cl.
CPC .......... *H01L 33/644* (2013.01); *H01L 33/505* (2013.01); *H01L 33/60* (2013.01);
(Continued)

(58) Field of Classification Search
CPC ....... H01L 33/505; H01L 33/60; H01L 33/62; H01L 33/641; H01L 33/642;
(Continued)

(56) References Cited

U.S. PATENT DOCUMENTS

| 8,957,440 B2* | 2/2015 | Ibbetson | H01L 33/54 257/98 |
| 2006/0163587 A1* | 7/2006 | Erchak | H01L 25/0753 257/82 |

(Continued)

FOREIGN PATENT DOCUMENTS

| JP | 2006351847 A | 12/2006 |
| JP | 2009267040 A | 11/2009 |

(Continued)

OTHER PUBLICATIONS

Schubert, Martin F., et al. "Distributed Bragg Reflector Consisting of High- and Low-Refractive-Index Thin Layers Made of the Same Material." Appl. Phys. Lett. 90, 141115, Apr. 2, 2007.*

(Continued)

*Primary Examiner* — Mark W Tornow
*Assistant Examiner* — Priya M Rampersaud

(57) ABSTRACT

A substantial amount of the light emitting surface area of a wavelength conversion element above a light emitting element is covered by a reflective thermal conductive element. The light that is reflected by this reflective element is 'recycled' within the light emitting structure and exits the structure through the smaller area that is not covered by the reflective element. Because the thermal conductive element does not need to be transparent, a relatively thick metal layer may be used; and, because the thermal conductive element covers a substantial area of the wavelength conversion element, the thermal efficiency of this arrangement is very high. The reflective thermal conductive element may be (Continued)

coupled to thermal conductive pillars, which may be mounted on a thermal conductive submount.

14 Claims, 4 Drawing Sheets

(51) Int. Cl.
*H01L 33/60* (2010.01)
*H01L 33/62* (2010.01)

(52) U.S. Cl.
CPC .......... *H01L 33/641* (2013.01); *H01L 33/642* (2013.01); *H01L 33/62* (2013.01)

(58) Field of Classification Search
CPC ....... H01L 33/644; H01L 33/64; H01L 33/50; H01L 2224/45144; H01L 2224/48091; H01L 2924/00; H01L 2924/00014; H01L 2224/13; H01L 33/501; H01L 33/502; H01L 33/58; H01L 2924/12044; H01L 2224/16; H01L 33/005; H01L 33/46; H01L 33/508; H01L 2933/0016; H01L 2933/0033; H01L 2933/005; H01L 33/08; H01L 33/54; H01L 2924/181; H01L 2924/00012; H01L 2924/0002; H01L 2224/05624; H01L 33/0507; H01L 2924/013; H01L 2924/04941; H01L 2224/05644; H01L 2224/48463; H01L 2924/01078; H01L 2924/01079; H01L 2224/05187; H01L 2224/05639; H01L 2924/12041; H01L 2933/0041; H01L 33/56; H01L 2924/01006; H01L 2924/01013; H01L 2924/01029; H01L 2924/01033; H01L 2924/01047; H01L 2924/01082; H01L 2924/014; H01L 2924/16195; H01L 2924/16315; H01L 2224/023; H01L 2224/05124; H01L 2224/05155; H01L 2224/05166; H01L 2224/05556; H01L 2224/0558; H01L 2224/1329; H01L 2224/13339; H01L 2224/16225; H01L 2224/45015; H01L 2224/48247; H01L 2224/48471; H01L 2224/48472; H01L 2224/48479; H01L 2224/48599; H01L 2224/48624; H01L 2224/48644; H01L 2224/48647; H01L 2224/854; H01L 24/05; H01L 25/0753; H01L 2924/01012; H01L 2924/01019; H01L 2924/01046; H01L 2924/01074; H01L 2924/12035; H01L 2924/20752; H01L 2924/351; H01L 33/22; H01L 33/44; H01L 33/486; H01L 2224/0555; H01L 2224/0556; H01L 2224/05568; H01L 2224/05573; H01L 2224/05599; H01L 2224/45099; H01L 2224/4554; H01L 2224/73253; H01L 2224/73265; H01L 24/03; H01L 24/13; H01L 24/24; H01L 2924/0001; H01L 2924/01014; H01L 2924/01028; H01L 2924/01032; H01L 2924/01051; H01L 2924/04953; H01L 2924/0665; H01L 2924/14; H01L 2933/0058; H01L 2933/0066; H01L 2933/0075; H01L 2933/0091; H01L 33/0075; H01L 33/32; H01L 33/38; H01L 33/385; H01L 33/405; H01L 33/483; H01L 33/52; H01L 21/02271; H01L 21/0262; H01L 21/2855; H01L 21/288; H01L 21/32134; H01L 21/32139; H01L 21/465; H01L 21/4803; H01L 21/4882; H01L 2224/02166; H01L 2224/04042; H01L 2224/05073; H01L 2224/05171; H01L 2224/0554; H01L 2224/05548; H01L 2224/13099; H01L 2224/13109; H01L 2224/16145; H01L 2224/4807; H01L 2224/48137; H01L 2224/48257; H01L 2224/48453; H01L 2224/81907; H01L 2224/85424; H01L 2224/85444; H01L 2224/85447; H01L 2224/8592; H01L 2251/5315; H01L 2251/558; H01L 23/3672; H01L 23/3675; H01L 23/3738; H01L 23/427; H01L 23/473; H01L 24/11; H01L 24/16; H01L 24/45; H01L 24/48; H01L 24/73; H01L 24/97; H01L 25/0756; H01L 25/50; H01L 27/1222; H01L 27/124; H01L 27/1288; H01L 27/1421; H01L 27/15; H01L 27/156; H01L 2924/01005; H01L 2924/01007; H01L 2924/01011; H01L 2924/01015; H01L 2924/01022; H01L 2924/01024; H01L 2924/01025; H01L 2924/0103; H01L 2924/01039; H01L 2924/01049; H01L 2924/0105; H01L 2924/01063; H01L 2924/01075; H01L 2924/01322; H01L 2924/05042; H01L 2924/18161; H01L 2924/19041; H01L 2924/19042; H01L 2924/19043; H01L 29/458; H01L 29/4908; H01L 29/66765; H01L 29/78669; H01L 29/78678; H01L 31/02021; H01L 31/02327; H01L 31/024; H01L 31/0504; H01L 31/052; H01L 31/054; H01L 33/007; H01L 33/0093; H01L 33/025; H01L 33/06; H01L 33/20; H01L 33/28; H01L 33/30; H01L 33/382; H01L 33/387; H01L 33/42; H01L 33/504; H01L 33/648; H01L 51/5203; H01L 51/5268; H01L 51/5271; H01L 51/5284; F21S 41/141; F21S 41/147; F21S 41/29; F21S 41/43; F21S 41/47; F21S 4/22; F21S 8/02; F21Y 2115/10; F21Y 2103/10; F21Y 2105/10; F21Y 2101/00; F21Y 2105/12; F21Y 2115/00; F21K 9/00; F21K 9/23; F21K 9/64; F21K 9/65; F21V 13/08; F21V 13/02; F21V 21/04; F21V 23/001; F21V 23/06; F21V 29/87; F21V 3/062; F21V 7/22; F21V 7/26; F21V 9/08; F21V 9/30; F21V 9/40; F21V 5/10; H05K 2201/10106; H05K 1/0203; H05K 1/0274; H05K 1/0306; H05K 1/144; H05K 1/189; H05K 2201/041; H05K 2201/049; H05K 2201/09036; H05K 2201/09063; H05K 2201/09827; H05K 2201/09872; H05K 2201/10098; H05K 2201/10977; H05K 3/284; H05K 7/20963; B60Q 1/0088; B82B 1/002;

F28F 3/025; G02B 19/0028; G02B 6/0073
See application file for complete search history.

(56) References Cited

U.S. PATENT DOCUMENTS

| | | | | |
|---|---|---|---|---|
| 2006/0163590 | A1* | 7/2006 | Erchak | F21K 9/00 257/88 |
| 2009/0014744 | A1* | 1/2009 | Hsieh | H01L 33/505 257/98 |
| 2009/0293270 | A1* | 12/2009 | Brindley | A61N 1/05 29/829 |
| 2011/0025190 | A1* | 2/2011 | Jagt | H01L 33/58 313/499 |
| 2011/0062469 | A1* | 3/2011 | Camras | H01L 33/58 257/98 |
| 2011/0210369 | A1 | 9/2011 | Daicho et al. | |
| 2013/0094179 | A1* | 4/2013 | Dai | F21V 3/02 362/84 |
| 2014/0167087 | A1* | 6/2014 | Wada | H01L 33/505 257/98 |
| 2014/0300267 | A1 | 10/2014 | Oh et al. | |
| 2016/0020374 | A1* | 1/2016 | Aketa | H01L 33/62 257/91 |

FOREIGN PATENT DOCUMENTS

| | | |
|---|---|---|
| JP | 2010528467 A | 8/2010 |
| JP | 2011515846 A | 5/2011 |
| JP | 2013505571 A | 2/2013 |
| JP | 2013077679 A | 4/2013 |
| JP | 2013105877 A | 5/2013 |
| JP | 2014127513 A | 7/2014 |
| JP | 2014140014 A | 7/2014 |
| KR | 1020130057676 A | 6/2013 |
| WO | 2010044240 A1 | 4/2010 |
| WO | 2011024934 A1 | 3/2011 |

OTHER PUBLICATIONS

EPO as ISA, "International Search Report and Written Opinion" dated Jun. 20, 2016 from International Application No. PCT/EP2016/056323, filed Mar. 23, 2016, 10 pages.
CN 201680019983.0, "Third Office Action," dated Mar. 3, 2020, 8 pages.
JP 2017-550723, "Office Action," dated Feb. 21, 2020, 10 pages.
First Office Action dated Mar. 1, 2019, Chinese Patent Application No. 201680019983.0, 12 pages.
TW App. No. 105109733, "OA dated Jun. 28, 2019," 8 pages.
Second Office Action dated Sep. 24, 2019, Chinese Application No. 201680019983.0, 7 pages.

* cited by examiner

A-A

PERIPHERAL HEAT SINKING ARRANGEMENT FOR HIGH BRIGHTNESS LIGHT EMITTING DEVICES

CROSS-REFERENCE TO RELATED APPLICATIONS

The present application is a § 371 application of International Application No. PCT/EP2016/056323 filed on Mar. 23, 2016 and titled "PERIPHERAL HEAT SINKING ARRANGEMENT FOR HIGH BRIGHTNESS LIGHT EMITTING DEVICES," which claims the benefit of U.S. Provisional Patent Application No. 62/139,820 filed on Mar. 30, 2015. International Application No. PCT/EP2016/056323 and U.S. Provisional Patent Application No. 62/139,820 are incorporated herein.

FIELD OF THE INVENTION

This invention relates to the field of light emitting devices, and in particular to a heat sinking arrangement for high brightness light emitting devices (HB-LED).

BACKGROUND OF THE INVENTION

Continuing improvements in the technology associated with solid-state light emitting devices (LEDs) has enabled light emitting devices to be used in applications requiring high brightness, such as vehicular and home lighting, outside area lighting, and so on.

A limitation to the amount of luminance that can be produced by a light emitting structure is the ability to dissipate the heat generated by the structure, particularly if the light emitting structure includes a wavelength conversion element, such as a phosphor layer. Excess heat produced in the light emitting structure may cause the elements in the structure to degrade prematurely, and may significantly affect the efficiency of the wavelength conversion, consequently generating additional heat. In some applications, even though the light emitting element may be able to produce very high brightness, it must be operated at a lower current, and consequently lower brightness, to avoid thermal damage.

FIGS. 1A-1B illustrate a prior-art light emitting structure that includes heat-dissipation features, as disclosed in USPA 2014/0167087, "LIGHT EMITTING DEVICE AND MANUFACTURING METHOD FOR THE SAME", published 19 Jun. 2014 for Wada et al., and incorporated by reference herein.

The top-view of FIG. 1A illustrates that the light emitting structure has a light extraction area 15 above a light emitting element 10. The light extraction area 15 is surrounded by a heat conductive frame 27, which is mounted on a heat dissipating submount 33.

The cross-section of FIG. 1B, illustrates a wavelength conversion plate 7 that extends over the light emitting element 10. A transparent heat-conducting film 21 covers the wavelength conversion plate 7, and provides the light extraction area 15. The heat-conducting film 21 is coupled to the heat-conductive frame 27 via solder 26. Heat from the wavelength conversion plate 7 is spread by the heat-conducting film 21, then dissipated by the heat-conductive frame 27 and the heat dissipating submount 33.

Although the structure of FIGS. 1A-1B is well suited for dissipating the heat generated by the wavelength conversion plate 7, the requirement for the film 21 to be transparent as well as thermal conductive limits the capabilities of the film 21 to do both, because increasing the thermal conductivity reduces the transparency, and vice versa. Also, the cost of producing such a transparent thermal conductive film is relatively high.

SUMMARY OF THE INVENTION

It would be advantageous to provide a light emitting structure with thermal dissipation capabilities that enables the light emitting element to be operated with a higher luminance than conventional light emitting structures. It would also be advantageous to reduce the cost of producing a light emitting structure with thermal dissipation capabilities.

To better address one or more of these concerns, in an embodiment of this invention, a substantial amount of the light emitting surface area of a wavelength conversion element above a light emitting element is covered by a reflective thermal conductive element. The light that is reflected by this reflective element is 'recycled' within the light emitting structure and exits the structure through the smaller area that is not covered by the reflective element. If the reflectivity is high enough, a net increase in luminance can be realized as the light escapes through the reduced exit window. Because the thermal conductive element does not need to be transparent, a relatively thick metal layer may be used; and, because the thermal conductive element covers a substantial area of the wavelength conversion element, the thermal efficiency of this arrangement is very high. The reflective thermal conductive element may be coupled to thermal conductive pillars, which may be mounted on a thermal conductive submount.

An embodiment of this invention includes a light emitting element; a wavelength conversion element coupled to the light emitting element; a reflective thermal conductor that covers a majority of the surface area of the wavelength conversion element; at least one pair of thermal pillars situated on opposing sides of the wavelength conversion element; and a thermal coupling element that couples the reflective thermal conductor to the pair of thermal pillars.

The thermal pillars may surround the wavelength conversion element, or situated on select sides of the wavelength conversion element to facilitate a linear arrangement of multiple light emitting devices.

The entire structure may be mounted on a thermal conductive substrate, and a reflective dielectric material may surround the light emitting element and the wavelength conversion element.

The reflective thermal conductive element may include a reflecting layer and a thermal spreading layer, wherein the reflecting layer includes a Distributed Bragg Reflector (DBR), and the thermal spreading layer includes a metal layer at least 10 um thick. The thermal conductive element may be coupled to the thermal pillars by a thermal coupling element, which may include metal that is at least 10 um thick, and may be a flexible laminate to accommodate thermal stress.

The wavelength conversion element may include a ceramic phosphor plate, and the light extraction area may be less than 25% of the area of the surface of the wavelength conversion element.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Figure 1A:
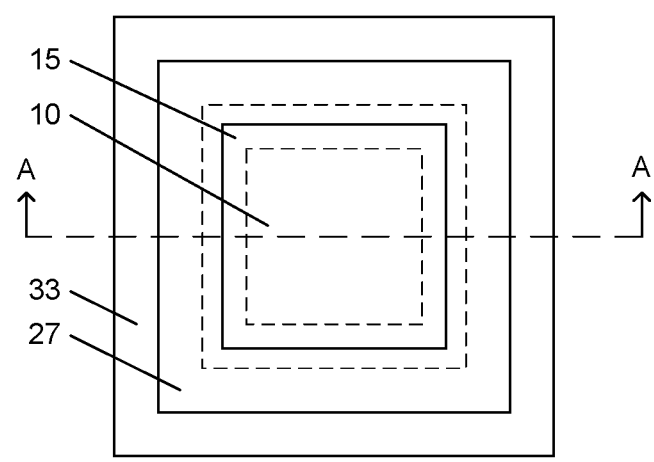
FIGS. 1A-1B illustrate a prior art light emitting structure with a transparent heat conductive film that covers a wavelength conversion element.
Figure 1B:
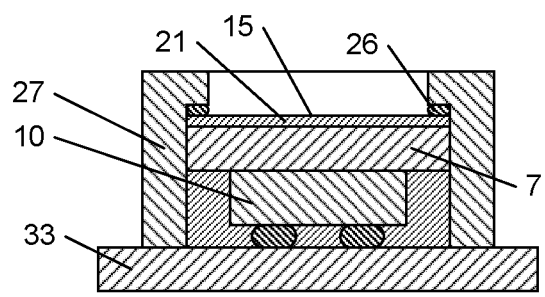
Figure 2A:
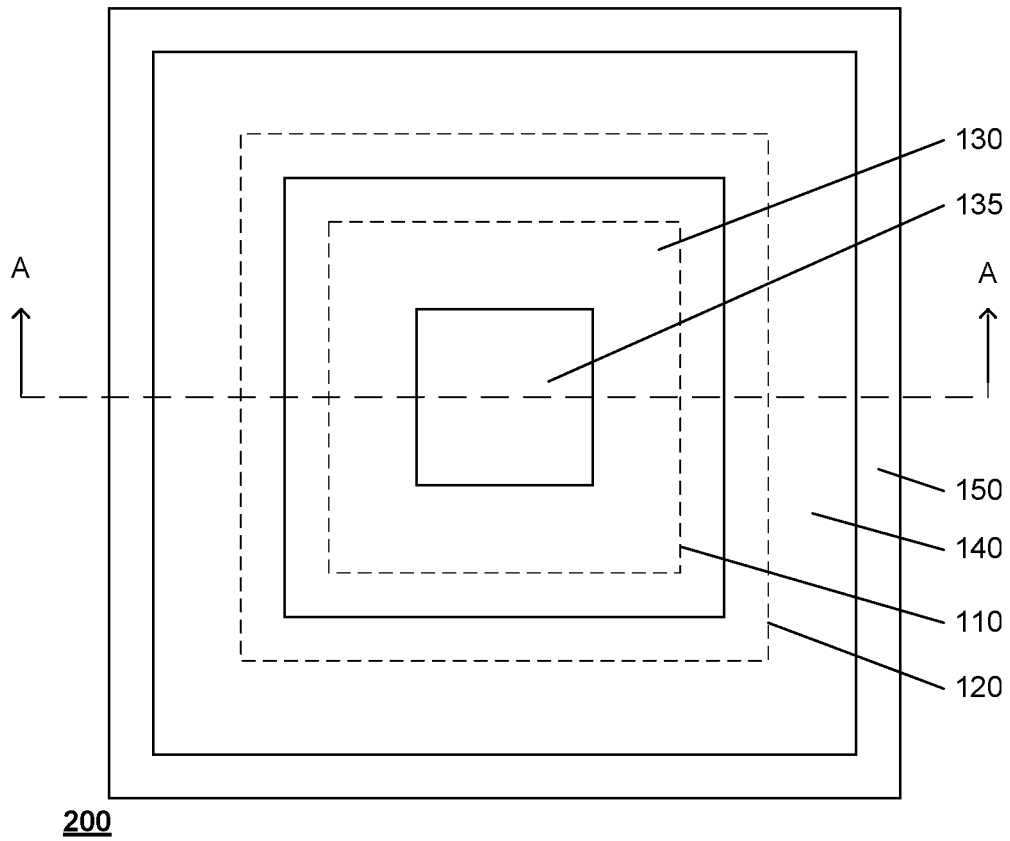
FIGS. 2A-2B illustrate an example light emitting structure that includes a reflective thermal conductor that covers a substantial surface area of the wavelength conversion element.
Figure 2B:
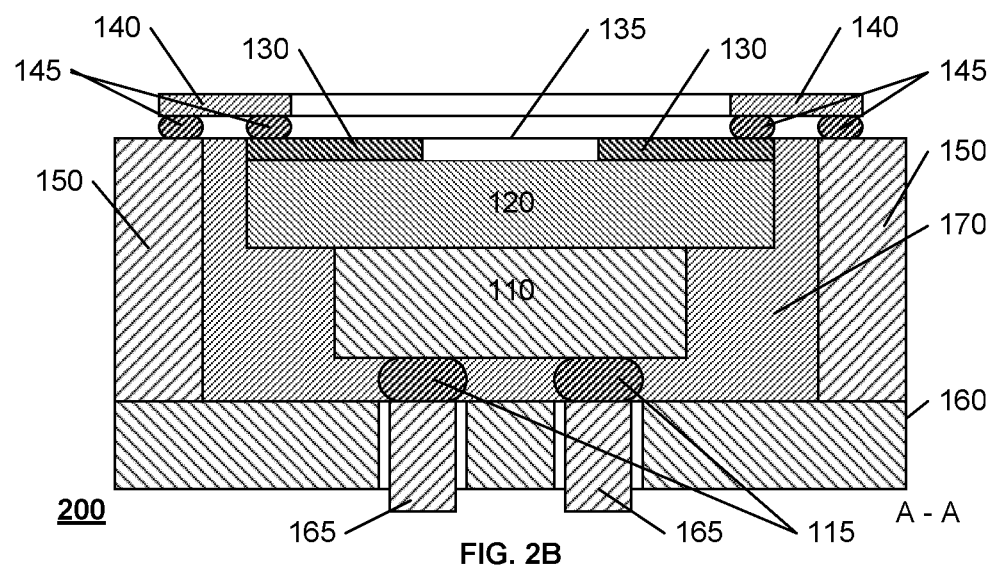

FIGS. 2A-2B illustrate an example light emitting structure 200 that includes a reflective thermal conductor 130 that covers a substantial amount of surface area of the wavelength conversion element 120. The wavelength conversion element may be illuminated (pumped) by a light emitting element 110. In the context of this disclosure, a thermal conductor is a material having a thermal conductivity of at least 25 W/m° K., preferably over 100 W/m° K., and a reflective element is an element having a reflectance with respect to the light emitted by the wavelength conversion element 120 and/or the light emitted by the light emitting element 110. The reflectance may be either specular or diffuse, of at least 90%, preferably over 98%.

The reflective thermal conductor 130 includes a window 135 through which light from the light emitting element 110 and wavelength conversion element 120 is extracted. Light that strikes the reflective element 130 is reflected back into the wavelength conversion element 120. A reflective filler material 170, such as $TiO_2$, may surround the wavelength conversion element 120 and the light emitting element 110, which serves to also reflect the light. The effect of these reflections amounts to a "recycle" of the light until it exits through the window 135. This concentration of extracted light to the smaller area of the window 135 results in a higher luminance (intensity of light per unit area traveling in a given direction) from the structure 200.

The reflective thermal conductor 130 may be a thick (~10-20 um) reflective metal layer, such as silver or other highly reflective material. To minimize optical loss, however, a highly reflective coating may be provided on any heat conductive material. For example, the thermal conductor 130 may include a stack of optically thin dielectric layers to provide a wideband omnidirectional Distributed Bragg Reflector (DBR) at the interface between the wavelength conversion element 120 and the heat conductive material, such as 10-20 um thick metal, of the thermal conductor 130.

The reflective thermal conductor 130 is coupled to thermal conductive walls, or 'thermal pillars' 150 that surround the wavelength conversion element 120 via a thermal coupling element 140. The thermal pillars 150 may be any thermal conductive material, with sufficient mass to efficiently serve as a heat sink via the thermal conductor 130, such as metal pillars at least 1 mm thick. The thermal pillars 150 may be further coupled to a thermal conductive submount 160, which also serves as a heat sink, may subsequently be mounted on a printed circuit board or other fixture. Insulated contacts 165 may be provided in the submount to provide electrical coupling the contacts 115 of the light emitting element 110.

The thermal pillars 150 and submount 160 may be a single element, such as a metal plate that is 'punched' to form the pillars, or a molded sintered metal. Although the thermal pillars 150 are illustrated as forming a continuous wall surrounding the wavelength conversion element 120, one of skill in the art will recognize that separated discrete pillars 150 may also be used.

The thermal coupling element 140 may couple the thermal conductor 130 to the thermal pillars 150 via solder 145 or other thermal conductive material. The coupling element 140 may be flexible, to mitigate problems associated with thermal stress. A laminated thermal spreader, about 20-50 um thick, may provide such flexibility. AvCarb® Heat Speaders, for example, are available in 0.025 mm thick flexible sheets and offer a thermal conductivity of 1650 W/m° K.

Figure 3A:
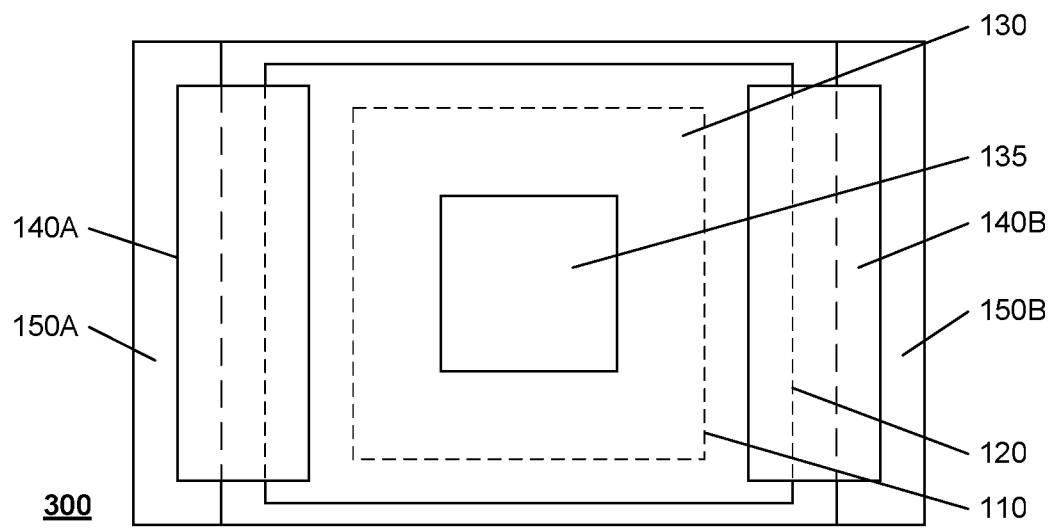
FIGS. 3A-3B illustrate example alternative light emitting structures that include a reflective thermal conductor that covers a substantial surface area of the wavelength conversion element.
Figure 3B:
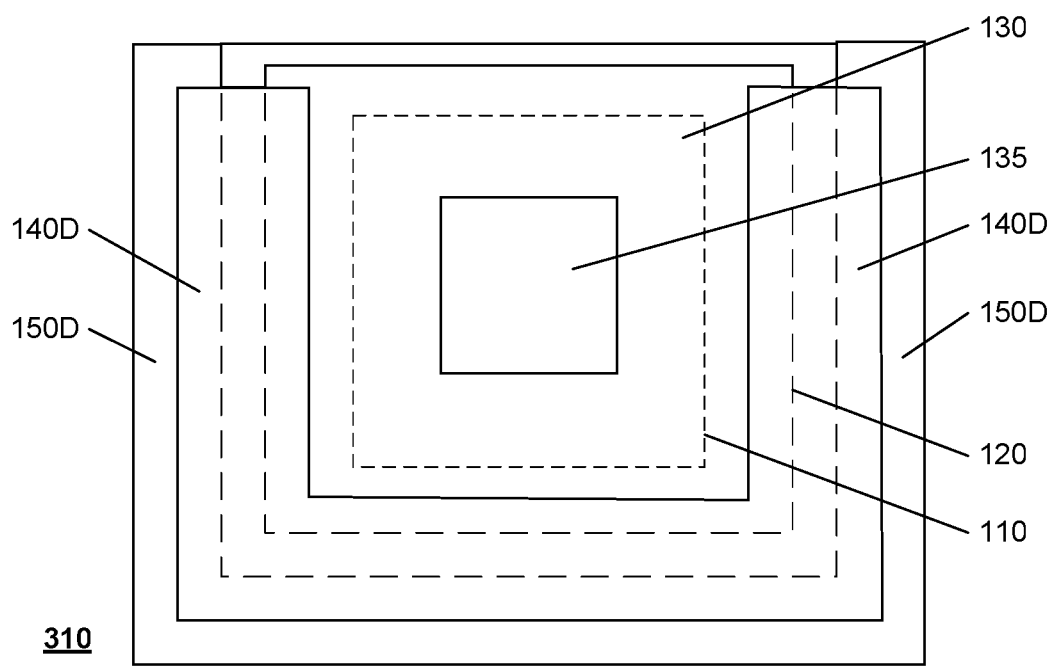

FIGS. 3A-3B illustrate example alternative light emitting structures 300, 310 that are particularly well suited for multiple LED applications. The structures 300, 310 are similar to the structure 200 of FIGS. 2A-2B. These structures have a profile (not illustrated) corresponding in at least one direction to the profile of FIG. 2B. The profiles in the orthogonal direction will be evident to one of skill in the art based on the combination of FIGS. 3A, 3B, and FIG. 2B.

The structures 300, 310 are configured to form a linear arrangement of light emitting structures. Structure 300 includes a pair of opposing thermal pillars 150A, 150B, and a pair of opposing thermal coupling elements 140A, 140B in contrast to the surrounding pillars 150 of structure 200. The absence of thermal pillars on opposing sides facilitate placing multiple structures 300 in line, with minimal space between the structures 300. The structure 310 is configured with a three sided pillar 150D, and a three sided thermal coupling element 140D and may serve as an end structure to the aforementioned linear arrangement of structures. Although three sided pillar 150D is presented a single continuous body it may be configured as multiple bodies e.g. three separate pillars, a corner pillar and separate pillar or any other suitable configuration. Likewise pillars 150A, 150B may be constructed of multiple bodies or sections.

Figure 4A:
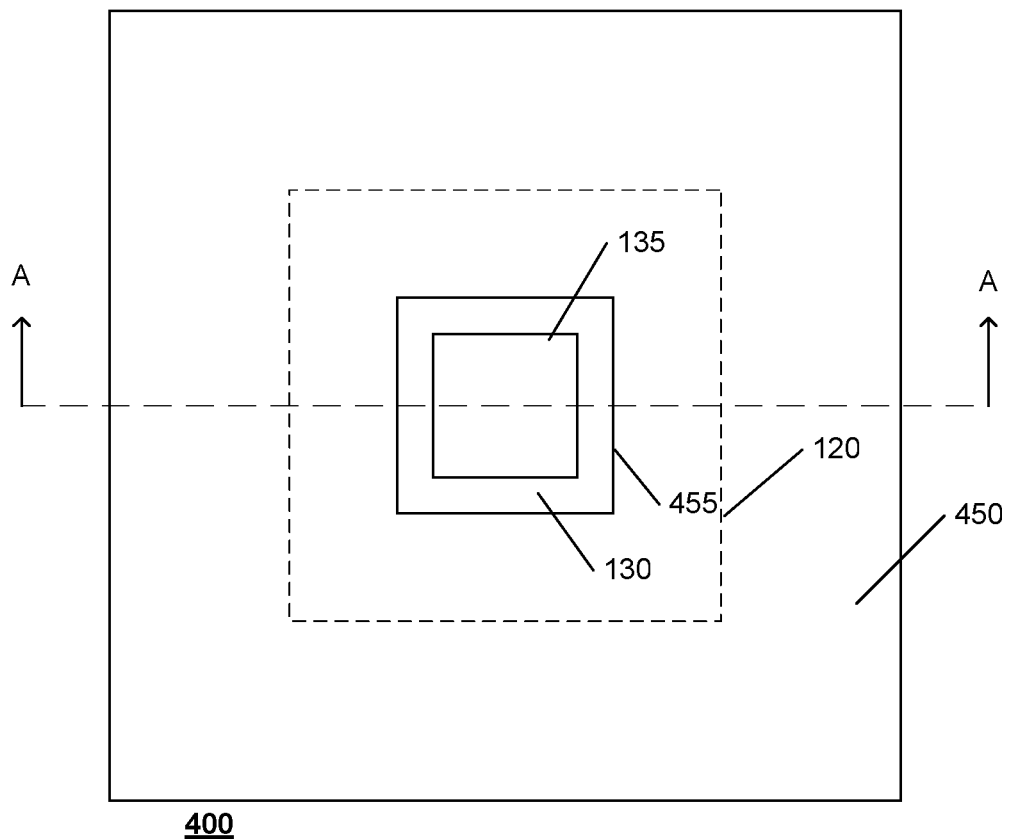
FIGS. 4A-4B illustrate another example light emitting structure that include a reflective thermal conductor that covers a substantial surface area of the wavelength conversion element.
Figure 4B:
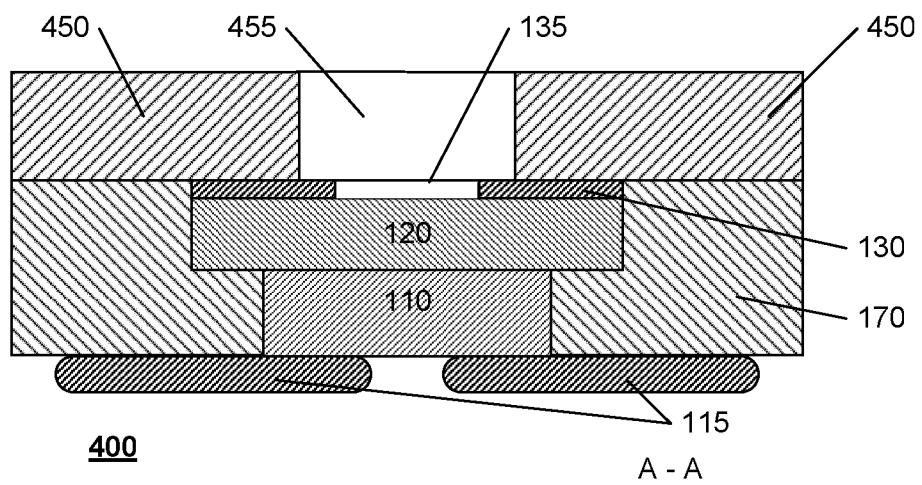

FIGS. 4A-4B illustrate another example alternative light emitting structure 400 that may be used for applications that do not require extensive heat dissipation. In this embodiment, a thermal cover 450 replaces the thermal pillars 150 of structure 200, and serves as a heat sink for the wavelength conversion element 120, via the reflective thermal conductor 130. The thermal cover 450 is illustrated as a separate element from the reflective thermal conductor 130, although it could be the thermal conductive component of the reflective thermal conductor 130. That is, for example, the thermal cover 450 could include a reflective coating, such as the aforementioned DBR, thereby forming a reflective thermal conductor.

Although the structure 400 is illustrated as cube-shaped, with the reflective filler 170 extending beneath the entire thermal cover 450, one of skill in the art will recognize that the thermal cover 450 could be cantilevered, extending beyond the reflective filler portion of the structure, increasing the surface area exposed to the atmosphere for dissipating heat.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A light emitting structure comprising:
   a light emitting element;
   a wavelength conversion element atop the light emitting element;
   a thermal conductor atop the wavelength conversion element, the thermal conductor having a reflectance of at least 90% and covering a majority of a surface area of the wavelength conversion element to define a covered area and an uncovered area, the uncovered area being a light extraction area comprising less than 25% but greater than 0% of the surface area of the wavelength conversion element;
   a continuous thermal pillar surrounding the light emitting element with at least a portion of the continuous thermal pillar extending in a first direction across an entire length of the uncovered area, the first direction being parallel to the plane of the uncovered area, the continuous thermal pillar not overlapping with the wavelength conversion element in a second direction perpendicular to the plane of the uncovered area; and
   a thermal coupling element extending from a top surface of the thermal conductor laterally to a top surface of the continuous thermal pillar, the thermal coupling element being distinct from the thermal conductor and the continuous thermal pillar.

2. The light emitting structure of claim 1, further comprising a thermal conductive substrate upon which the continuous thermal pillar is situated.

3. The light emitting structure of claim 1, wherein the thermal coupling element comprises metal that is at least 10 µm thick.

4. The light emitting structure of claim 1, wherein the thermal coupling element bends in response to thermal stress and comprises a flexible material that withstands repeated bending.

5. The light emitting structure of claim 1, wherein the thermal coupling element comprises a laminated material.

6. The light emitting structure of claim 1, wherein the thermal conductor comprises a reflecting layer and a thermal spreading layer.

7. The light emitting structure of claim 6, wherein the reflecting layer comprises a Distributed Bragg Reflector (DBR).

8. The light emitting structure of claim 6, wherein the thermal spreading layer includes a metal layer at least 10 µm thick.

9. The light emitting structure of claim 1, wherein the wavelength conversion element comprises a ceramic phosphor plate.

10. The light emitting structure of claim 1, including a reflective dielectric material that surrounds the light emitting element and the wavelength conversion element.

11. The light emitting structure of claim 1, wherein the thermal conductor is silver.

12. The light emitting structure of claim 1, wherein the thermal conductor has a thermal conductivity over 100 W/m° K.

13. The light emitting structure of claim 1, wherein the continuous thermal pillar does not overlap with the wavelength conversion element in a second direction perpendicular to the plane of the uncovered area.

14. The light emitting structure of claim 1, wherein the continuous thermal pillar does not overlap with the thermal conductor in a second direction perpendicular to the plane of the uncovered area.

* * * * *